(12) United States Patent
Kang (10) Patent No.: US 11,043,405 B2
(45) Date of Patent: Jun. 22, 2021

(54) PARTICLE REDUCTION IN SEMICONDUCTOR FABRICATION

(71) Applicant: TAIWAN SEMICONDUCTOR MANUFACTURING CO., LTD., Hsinchu (TW)

(72) Inventor: Ting-Yu Kang, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 35 days.

(21) Appl. No.: 16/364,407

(22) Filed: Mar. 26, 2019

(65) Prior Publication Data
US 2020/0312700 A1    Oct. 1, 2020

(51) Int. Cl.
| | |
|---|---|
| H01L 21/683 | (2006.01) |
| H01L 21/66 | (2006.01) |
| H01L 21/677 | (2006.01) |
| H01L 21/687 | (2006.01) |
| H01L 21/67 | (2006.01) |

(52) U.S. Cl.
CPC .... *H01L 21/6838* (2013.01); *H01L 21/67219* (2013.01); *H01L 21/67742* (2013.01); *H01L 21/68707* (2013.01); *H01L 22/26* (2013.01)

(58) Field of Classification Search
CPC .................................................. H01L 21/6838
See application file for complete search history.

(56) References Cited

U.S. PATENT DOCUMENTS

| | | | | |
|---|---|---|---|---|
| 6,446,948 | B1 * | 9/2002 | Allen | B25B 11/005 118/500 |
| 8,336,188 | B2 * | 12/2012 | Monteen | H01L 21/6838 29/559 |
| 2002/0001920 | A1 * | 1/2002 | Takisawa | H01L 21/67092 438/455 |

FOREIGN PATENT DOCUMENTS

| | | | |
|---|---|---|---|
| CN | 203733770 U | * | 7/2014 |
| KR | 20080010650 A | * | 1/2008 |

* cited by examiner

*Primary Examiner* — Gerald McClain
(74) *Attorney, Agent, or Firm* — McClure, Qualey & Rodack, LLP (57) ABSTRACT

A method includes transferring a wafer from a process chamber onto a plurality of robotic fingers outside the process chamber, elevating a wafer chuck until reaching the wafer, applying a first suction force to the wafer using a vacuum hole on the wafer chuck, and applying a second suction force toward the wafer using a porous pipe around the wafer chuck.

20 Claims, 10 Drawing Sheets

PARTICLE REDUCTION IN SEMICONDUCTOR FABRICATION

BACKGROUND

The semiconductor integrated circuit (IC) industry has experienced exponential growth in recent year. Integrated circuits are formed on semiconductor wafers. The semiconductor wafers are then sawed into chips. The formation of integrated circuits includes many process steps such as deposition, chemical mechanical polish (CMP), plating, and the like. Accordingly, wafers are transported between different equipment.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 1:
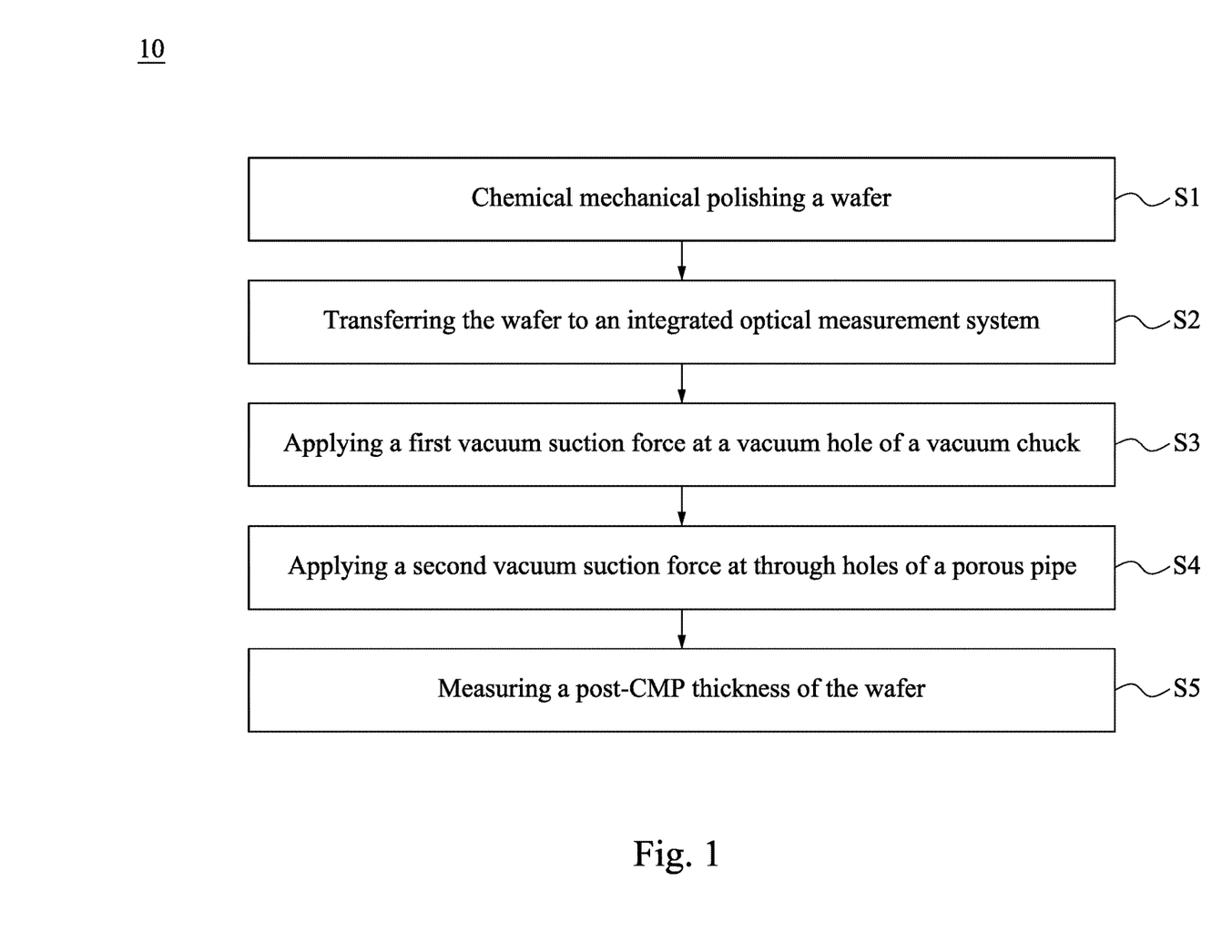
FIG. 1 is a flow chart of a method for chemical mechanical polishing (CMP) and post-CMP thickness measurement of a wafer according to various aspects of the present disclosure.

FIG. 1 is a flow chart of a method 10 of chemical mechanical polishing (CMP) and a post-CMP thickness measurement of a wafer according to various aspects of the present disclosure. FIGS. 2-7 are cross-sectional views of some embodiments of graphical representations of apparatuses according to various stages of the method 10 of FIG. 1. The illustration is merely exemplary and is not intended to be limiting beyond what is specifically recited in the claims that follow. It is understood that additional operations may be provided before, during, and after the operations shown by FIG. 1, and some of the operations described below can be replaced or eliminated for additional embodiments of the method. The order of the operations/processes may be interchangeable.

Figure 2:
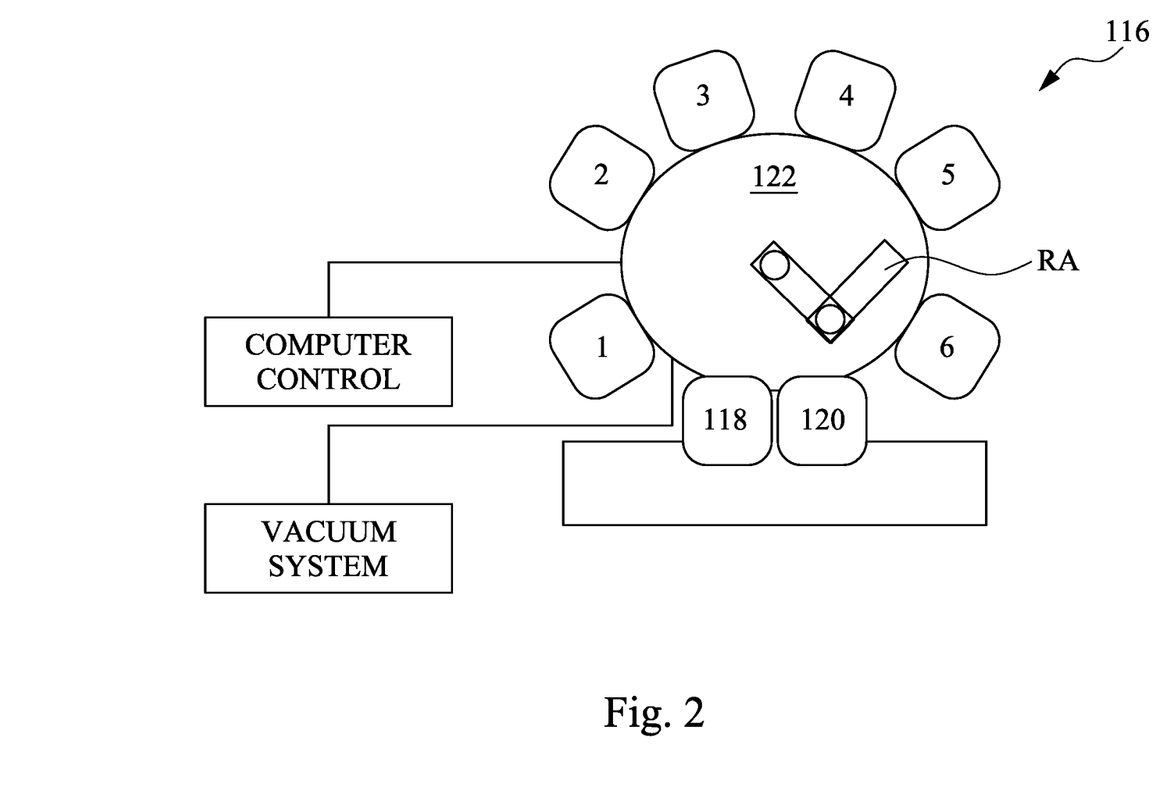
FIG. 2 is a schematic top-view diagram of an exemplary multi-chamber processing system in accordance with some embodiments.
Figure 3:
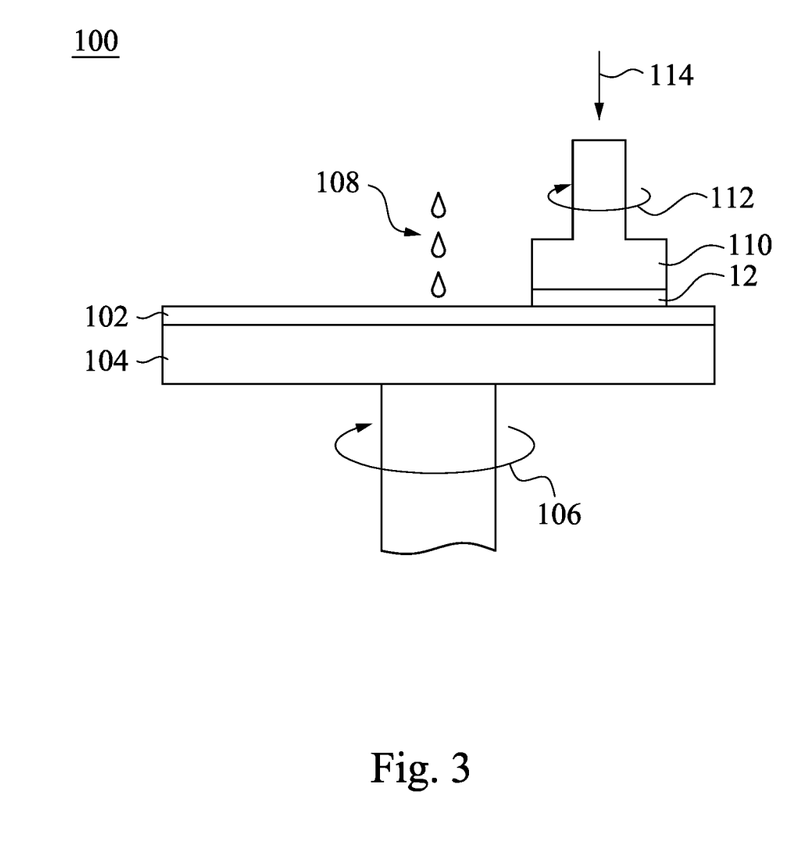
FIG. 3 is a cross-sectional view of a CMP tool in accordance with some embodiments.

Reference is made to FIG. 1. The method 10 begins at block S1 where the wafer is chemical mechanical polished using a CMP tool. With reference to FIGS. 2 and 3, in some embodiments of block S1, the wafer 12 is transferred to the CMP tool 100 using a multi-chamber processing system 116 and is then planarized using the CMP tool 100 to polish and reduce the thickness of the wafer. Throughout the CMP process, a thickness of the wafer is reduced from a pre-CMP thickness to a target thickness (e.g., a post-CMP thickness).

FIG. 2 shows the multi-chamber processing system 116. Referring now to FIG. 2, illustrated therein is a schematic top-view diagram of an exemplary multi-chamber processing system 116. In some embodiments, the system 116 may be equivalently referred to as a "cluster tool". The system 116 may generally include load lock chambers 118, 120, a wafer handling chamber 122, and a plurality of processing chambers C1-C6. In some embodiments, the load lock chambers 118 and 120 provide for the transfer of wafers into and out of the system 116. In various embodiments, the system 116 is under vacuum, and the load lock chambers 118 and 120 may "pump down" the wafers introduced into the system 116 (e.g., by way of a mechanical pump and/or a turbomolecular pump). In some embodiments, the load lock chambers 118 and 120 may be adapted to receive a single wafer or a plurality of wafers (e.g., loaded into a cassette). By way of example, the load lock chambers 118 and 120 may be separated from the wafer handling chamber 122 by way of a gate valve, allowing the wafer handling chamber 122 to remain under vacuum when one or both of the load lock chambers 118 and 120 are vented.

In some embodiments, the wafer handling chamber 122 is equipped with an automated robotic arm RA that may move smoothly along any of a horizontal, vertical, and/or rotational axis so as to transfer wafers between the load lock chambers 118, 120 and any of the substrate processing chambers C1-C6. Each processing chamber C1-C6 may be configured to perform a number of substrate processing operations such as CMP, ALD, CVD, PVD, etching, as well as a number of metrology operations such as post-CMP thickness measurement, XPS analysis, AFM analysis, and/or other suitable processing or metrology operations. For example, one of the processing chambers C1-C6 may include a CMP tool 100 as shown in FIG. 3. In some embodiments, the wafer 12 is transferred from another of the processing chambers C1-C6 to the CMP tool 100 using the automated robotic arm RA. In various embodiments, the system 116 may have more or less processing chambers.

FIG. 3 shows a CMP tool 100. The wafer 12 is loaded from the wafer handling chamber 122 into the CMP tool 100 using the automated robotic arm RA as shown in FIG. 2. A polishing pad 102 is affixed to a circular polishing table 104 that rotates in a direction indicated by arrow 106. Slurry 108 is dispensed over a surface of the polishing pad 102. A wafer carrier 110 is used to hold the wafer 12 face down against the polishing pad 102. The wafer 12 is held in place by applying a vacuum to a backside of the wafer 12 (not shown). The wafer 12 can also be attached to the wafer carrier 110 by the application of a substrate attachment film (not shown) to the lower surface of the wafer carrier 110. The wafer carrier 110 also rotates as indicated by arrow 112, usually in the same direction as the polishing table 104. Due to the rotation of the polishing table 104, the wafer 12 traverses a circular polishing path over the polishing pad 102. A force 114 is also applied in the downward vertical direction against wafer 12 and presses the wafer 12 against the polishing pad 102 as it is being polished.

Figure 4:
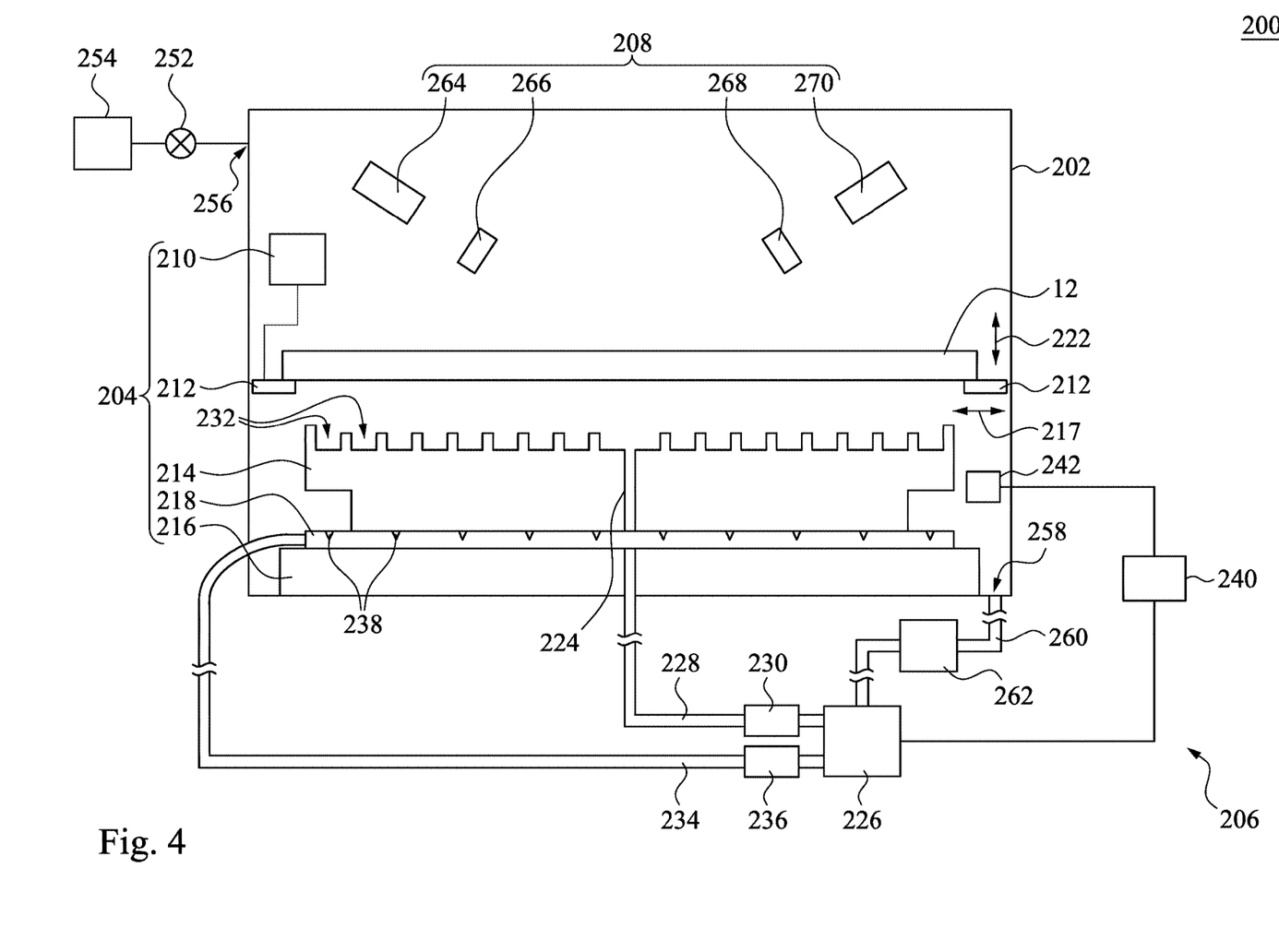
FIGS. 4-7 show cross-sectional views of a post-CMP thickness measurement of the wafer at various stages in accordance with some embodiments.

Returning to FIG. 1, the method 10 then proceeds to block S2 where the wafer is transferred to an integrated optical measurement system. With reference to FIGS. 2 and 4, in some embodiments of block S2, the wafer 12 is transferred to an integrated optical measurement system 200 in one of the processing chambers C1-C6 using the automated robotic arm RA. In greater detail, after performing the CMP process on the wafer 12 using the CMP tool 100 in one of the processing chambers C1-C6, the automated robotic arm RA transfers the wafer 12 to the integrated optical measurement system 200 in another of the processing chambers C1-C6.

As shown in FIG. 4, in some embodiments, the integrated optical measurement system 200 includes a chamber 202 for operating the optical measurement. In some other embodiments, the integrated optical measurement system 200 may be a part of an inline chamber and/or an offline chamber. The integrated optical measurement system 200 includes a wafer handling apparatus 204, a vacuum supply unit 206 coupled to the wafer handling apparatus 204, and a measurement tool 208 within the chamber 202. The wafer handling apparatus 204 includes a first actuator system 210, a plurality of robotic fingers 212 operated by the first actuator system 210, a vacuum stage (e.g., a wafer chuck 214), a second actuator system 216, and a porous pipe 218. The porous pipe 218 is disposed at a height below a top surface of the wafer chuck 214. The second actuator system 216 is configured to raise and lower the wafer chuck 214. The wafer 12 is moved and handled by the automated robotic arm RA onto a plurality of robotic fingers 212. In greater detail, the wafer 12 is transferred from one of the processing chambers C1-C6 onto the robotic fingers 212 outside the one of the processing chambers C1-C6.

The robotic fingers 212 are movable either in a horizontal direction (as indicated by arrows 217) or in a vertical direction (as indicated by arrows 222). The robotic fingers 212 are adapted to support an edge portion of the wafer 12 to thereby reduce the contact area between the wafer 12 and the robotic fingers 212. In order to provide fine centering of the wafer to be monitored, at least three pin wafer holders (not shown) may be provided. Since the wafer's edge usually has an orientation mark (such as a notch or flat mark), pin wafer holders may be used in order to provide accurate centering and reliable supporting of arbitrary oriented wafer.

The wafer chuck 214 is used to support the wafer 12 during thickness measurement. The wafer chuck 214 may have a diameter that is suitable to hold the wafer 12. For example, the diameter of the wafer chuck 214 may be greater than half the diameter of the wafer 12 so as to stably hold the wafer 12. The wafer chuck 214 has a vacuum hole 224 extending vertically from a top surface of the wafer chuck 214 where the wafer 12 is located when the wafer 12 is loaded onto and secured to the wafer chuck 214 to a bottom surface of the wafer chuck 214. The vacuum hole 224 may be positioned at a location that corresponds to the center of the wafer 12. In some embodiments, there may be a single vacuum hole 224 at or near a position that corresponds to the precise center of the circular wafer 12. The vacuum supply unit 206 includes a vacuum generator (e.g., a vacuum pump 226), a first gas line 228, and a first valve 230. The vacuum pump 226 is connected to the vacuum hole 224 through the first gas line 228 to provide a first vacuum suction force to the vacuum hole 224. The first valve 230 is connected between the vacuum hole 224 and the vacuum pump 226. The first vacuum suction force will act on a central portion of the backside of the wafer 12 to secure (e.g., suck) the wafer 12. The wafer chuck 214 has a plurality of regularly arranged recesses 232 which are gaseously communicated with the vacuum pump 226 via the vacuum hole 224, forming a vacuum therein to fix a large-sized wafer. The backside of the wafer 12 is the side that is opposite the side receiving the lithographic processing. The vacuum hole 224 carries gas molecules away from the recesses 232, located below the wafer 12, to generate the low pressure vacuum within the recesses 232. The low pressure vacuum within the recesses 232 causes atmospheric pressure on a top surface of the wafer 12 to pull down on the wafer 12, thereby securing the wafer 12 to the wafer chuck 214.

In some embodiments, the first valve 230 may be disposed in the first gas line 228 to selectively control gaseous communication between the vacuum pump 226 and the wafer chuck 214. The first valve 230 may include one or more valves that may be independently operable. In some embodiments, the first valve 230 may include a throttle valve. However, any appropriate valve may be used to advantage including, for example, a gate valve. The first valve 230 is controlled to increase its opening degree when the vacuum pressure value becomes higher toward the atmospheric pressure than a desired value, thereby allowing the vacuum pump 226 to suck a larger amount of flow of the gas. Additionally, the first valve 230 is also controlled to decrease its opening degree when the vacuum pressure value becomes lower toward the absolute value than the desired value, thereby allowing the vacuum pump 226 to suck a lesser amount of flow of the gas.

The vacuum supply unit 206 further includes a second gas line 234 and a second valve 236. In some embodiments, the second valve 236 may be disposed in the second gas line 234 to selectively control gaseous communication between the vacuum pump 226 and the porous pipe 218. In greater detail, the second valve 236 is connected between the porous pipe 218 outside the wafer chuck 214 and the vacuum pump 226. The porous pipe 218 is disposed around a periphery of the wafer chuck 214. In other words, the porous pipe 218 encircles the wafer chuck 214. The porous pipe 218 includes a plurality of through holes 238 on a top surface of the porous pipe 218 formed using a hand-held implement, such as scissors, a knife or the like so that the through holes 238 can be cut to size at the jobsite. As used herein, the term "hand-held implement" or "hand implement" means a device with a sharp edge that is manually operated or operable to cut a sheet of material, such as a knife or scissors or box cutter, and specifically excludes machinery, a saw or any implement that has a power assist. The vacuum pump 226 is connected to the through holes 238 of the porous pipe 218 through the second gas line 234, so as to provide a second vacuum suction force to the through holes 238. In other words, the porous pipe 218 exhausts gas around the wafer chuck 214 through the through holes 238. The size and number of the through holes 238 depend on the size of the porous pipe 218 and the flow rate of the air through the second gas line 234. A size of the through holes 238 is less than a ring thickness of the ring-shaped porous pipe 218 (e.g. the ring thickness D2 of the ring-shaped porous pipe 218 in FIG. 8A). In some embodiments, the porous pipe 218 has a contour conformal to a contour of the wafer chuck 214. In some embodiments, the top-view contour of the porous pipe 218 is substantially circular, and the top-view contour of the wafer chuck 214 is substantially circular as well (see FIG. 8A). In some embodiments, the top-view contour of the porous pipe 218 is substantially rectangular, and the top-view contour of the wafer chuck 214 is substantially rectangular as well (see FIG. 8B). In some embodiments, a plurality of porous pipes 218 are disposed around the wafer chuck 214. In some embodiments where a plurality of the porous pipe 218 is disposed around a periphery of the wafer chuck 214, the porous pipes 218 may be distributed along the contour of the wafer chuck 214 (see FIG. 8C). The porous pipe 218 is configured to draw and collect contaminant particles from the backside of the wafer 12 through the through holes 238 during the operation of the wafer chuck 214, which will be further described in greater detail below. In some embodiments, the through holes 238 may be substantially equally spaced apart from each other. In some other embodiments, the through holes may be arranged randomly or may be arranged in a symmetrical and/or a regular pattern. However, it is understood that the number of the through holes 238 is only for illustration purposes and are not limiting.

The second valve 236 may include one or more valves that may be individually operated. In some embodiments, the second valve 236 may include a throttle valve. However, any appropriate valve may be used to advantage including, for example, a gate valve. The second valve 236 is controlled to increase its opening degree when the vacuum pressure value becomes higher toward the atmospheric pressure than a desired value, thereby allowing the vacuum pump 226 to suck a larger amount of flow of the gas. Additionally, the second valve is also controlled to decrease its opening degree when the vacuum pressure value becomes lower toward the absolute value than the desired value, thereby allowing the vacuum pump 226 to suck a lesser amount of flow of the gas.

The vacuum pump 226 may include any suitable type of variable speed vacuum pump. Examples of the vacuum pump 226 utilized for evacuating are roots pumps and hook and claw pumps. Other vacuum pump, such as turbo molecular pumps, rotary vane pumps, screw type pumps, tongue and groove pumps, positive displacement pumps, diaphragm pumps, centrifugal pumps, ejector pumps or other suitable source of vacuum. In some embodiments, the vacuum pump 226 is a Venturi pump. A Venturi pump is formed by reducing a flow area of a high pressure gas flow, for example, facilities air, that creates a suction pressure at the area of flow reduction.

Further, processing systems may use staged or cooperative pumping arrangements. For example, it may be desirable to have a first pump capable of pumping the wafer chuck 214 or the porous pipe 218 to a first pressure within a first pressure regime and a second pump capable of pumping the wafer chuck 214 or the porous pipe 218 to a second pressure within a second pressure regime, where the second pressure is lower than the first pressure. For example, the first pressure regime may be a very low-pressure regime and the second pressure regime may be an ultra-low-pressure regime. Accordingly, it is contemplated that the vacuum pump 226 may in fact represent two or more vacuum pumps 226, or the vacuum pump 226 may be connected to at least one other vacuum pump.

In some embodiments, the application of electrical power to the vacuum pump 226 may be controlled by a system controller 240, which is coupled to the vacuum pump 226. In addition to controlling a power signal to the vacuum pump 226, the system controller 240 may be more generally configured to control at least some of the components of the vacuum supply unit 206. The system controller 240 may be any device capable of controlling the operation(s) of the first valve 230 and the second valve 236. For example, the system controller 240 can independently and selectively control the opening and closing of each of the first valve 230 and the second valve 236. The system controller 240 may be a computer or another device suitable for automation.

The chamber 202 may include other mechanical components such as a gas valve 252 for selectively flowing gases from gas source 254 through an inlet port 256 into the chamber 202. An exhaust port 258 may be formed in a bottom of the chamber 202. The vacuum pump 226 may be coupled to the chamber by a foreline 260 disposed between the exhaust port 258 and the vacuum pump 226. In some embodiments, a third valve 262 may be disposed in the foreline 260 to control fluid communication between the vacuum pump 226 and the chamber 202. Illustratively, the third valve 262 may include one or more valves that may be individually operated. In some embodiments, the third valve 262 may include a throttle valve. However, any appropriate valve may be used to advantage including, for example, a gate valve.

The vacuum supply unit 206 includes a sensor 242 coupled to the system controller 240. In some embodiments, the sensor 242 may include a camera, an optical sensor, proximity sensor, or other suitable devices capable of inspecting the backside of the wafer 12. The system controller 240 can determine whether a contaminant particle is present on the backside of the wafer 12 based on the inspection result of the backside of the wafer 12 (e.g., an image of the backside of the wafer 12 captured by the camera 242), and turn on the second valve 236 to apply the second vacuum suction force F2 when the determination determines that the particle is present.

The measurement tool 208 includes a light source 264, a polarizer 266, an analyzer 268, and a detector 270. It is noted that the measurement tool 208 may include other elements, such as a compensator between the polarizer 266 and the wafer chuck 214 and/or the between the wafer chuck 214 and the analyzer 268.

Figure 5:
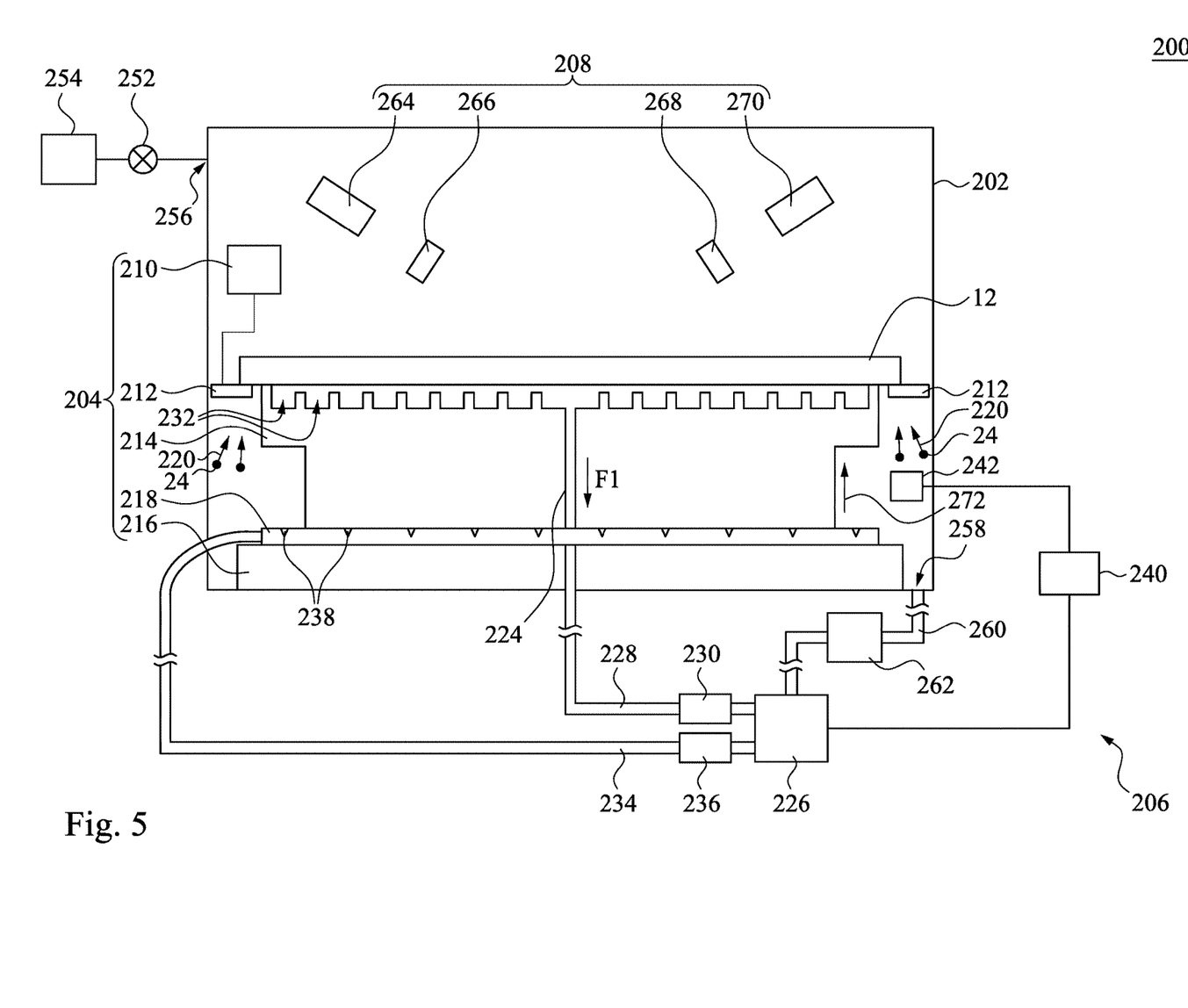

Returning to FIG. 1, the method 10 then proceeds to block S3 where a first vacuum suction force is applied at a vacuum hole of a wafer chuck to secure the wafer on the wafer chuck. With reference to FIG. 5, in some embodiments of block S3, the wafer 12 is secured by a first vacuum suction force F1 applied at a vacuum hole 224 of a wafer chuck 214. The measurement tool 208 and the robotic fingers 212 are situated above the wafer chuck 214. The wafer chuck 214 is movable in a vertical direction (as indicated by an arrow 272). The movement of the wafer chuck 214 may be helpful in loading or unloading the wafers, and fine movement may enable auto-focusing when using optical monitoring apparatus. The wafer chuck 214 may be moved upwards, for example, towards the measurement tool 208 and the robotic fingers 212, by the second actuator system 216, which can drive the wafer chuck 214 in a vertical direction to the appropriate height. In greater detail, the wafer chuck 214 is elevated until the wafer chuck 214 reaches (e.g., in contact with) the wafer 12. A distance between the wafer 12 and the wafer chuck 214 is reduced until the wafer 12 is in contact with the wafer chuck 214. By turning on the first valve 230 (e.g., by controlling the system controller 240 to control the opening degree of the first valve 230), the wafer chuck 214 holds the wafer 12 by a first vacuum suction force F1 at the vacuum hole 224 created by the vacuum pump 226 through the first gas line 228. In some embodiments, the applying of the first vacuum suction force F1 at the vacuum hole 224 and the elevating of the wafer chuck 214 are executed simultaneously. In some other embodiments, the first vacuum suction force F1 at the vacuum hole 224 is applied after the wafer chuck 214 is in contact with the wafer 12. In greater detail, the system controller 240 may adjust the first valve 230 based on the physical contact between the wafer chuck 214 and the wafer 12 so as to control (e.g., apply) the first vacuum suction force F1 at the vacuum hole 224.

However, the first vacuum suction force F1 may lead to drawing contaminants in the chamber 202 (e.g., contaminant particles 24) toward the wafer 12 (e.g., along a direction 220) and hence gathered on the backside of the wafer 12. In other words, the first valve 230 is turned on such that the contaminants in the chamber 202 (e.g., contaminant particles 24) is drawn to the wafer 12. For example, these contaminant particles 24 may be distributed on a periphery region of the backside of the wafer 12. In some embodiments where the wafer chuck 214 is circular, the contaminant particles 24 on the backside of the wafer 12 are distributed in an annular shape. In other words, a contour of a geometry distribution of the contaminant particles 24 is substantially the same as a contour of the wafer chuck 214. Potential contaminant particles 24 include unwanted particles, metals, organic molecules, or the like. The unwanted particles may be dust collected during wafer transfer and/or deposits such as remnants of patterned material or by-products formed during previous processing steps. Such contaminant particles 24 may cause problems during subsequent processing steps. For example, the contaminant particles 24 may cause the wafer 12 to be tilted or offset relative to the wafer chuck 214, which in turn might result in imprecise post-CMP thickness measurement results. It is understood that the wafer 12, the contaminant particle 24, and the integrated optical measurement system 200 are not drawn in scale.

Figure 6:
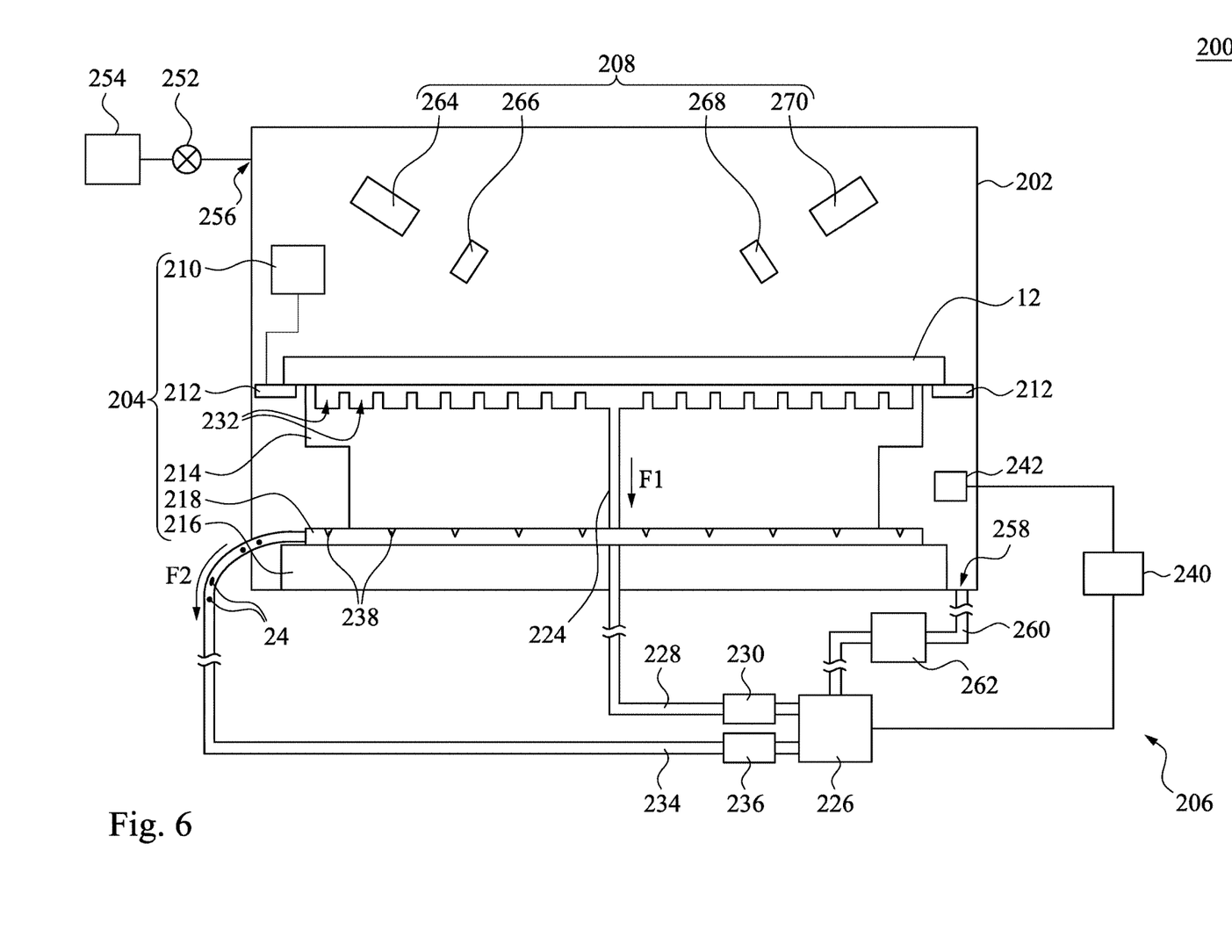

Returning to FIG. 1, the method 10 then proceeds to block S4 where a second vacuum suction force is applied at through holes of the porous pipe. With reference to FIG. 6, in some embodiments of block S4, a second vacuum suction force F2 is applied at the through holes 238 of the porous pipe 218 by controlling the system controller 240. The second vacuum suction force F2 is applied when the determination by the system controller 240 determines that the contaminant particles 24 are present on the backside of the wafer 12. Depending on such determination by the system controller 240, the second valve 236 may be turned on continuously or may be turned on and off intermittently by controlling the system controller 240. In other words, second vacuum suction force F2 may be continuously applied or may be intermittently applied by the system controller 240. By turning on the second valve 236 (e.g., by controlling the system controller 240 to control the opening degree of the second valve 236), the porous pipe 218 is in gas communication with the chamber 202 through the through holes 238. Such second vacuum suction force F2 can draw away the contaminant particles 24 on the backside of the wafer 12. In other words, the second valve 236 is turned on such that the contaminant particles 24 are drawn away from the wafer 12. In some embodiments, the first valve 230 and the second valve 236 are asynchronously controlled by the system controller 240. For example, the step of applying the second vacuum suction force F2 using the porous pipe 218 is carried out after applying the first vacuum suction force F2 using the vacuum hole 224. In other words, the second valve 236 is turned on after turning on the first valve 230. In some embodiments, the second vacuum suction force F2 applied using the porous pipe 218 is maintained during applying the first suction force F1 using the vacuum hole 224 on the wafer chuck 214. In some embodiments, the step of applying the second vacuum suction force F2 is prior to the step of applying the first vacuum suction force F1. In some other embodiments, the step of applying the first vacuum suction force F1 and the step of applying the second vacuum suction force F2 are carried out simultaneously. In some embodiments, the second vacuum suction force F2 applied to the through holes 238 is substantially greater than or equal to the first vacuum suction force F1 applied to the vacuum hole 224. If the second vacuum suction force F2 is less than the first vacuum suction force F1, the contaminant particles 24 may not be effectively drawn away by the porous pipe 218. In some embodiments, the porous pipe 218 is made of plastic material or composite material.

Figure 7:
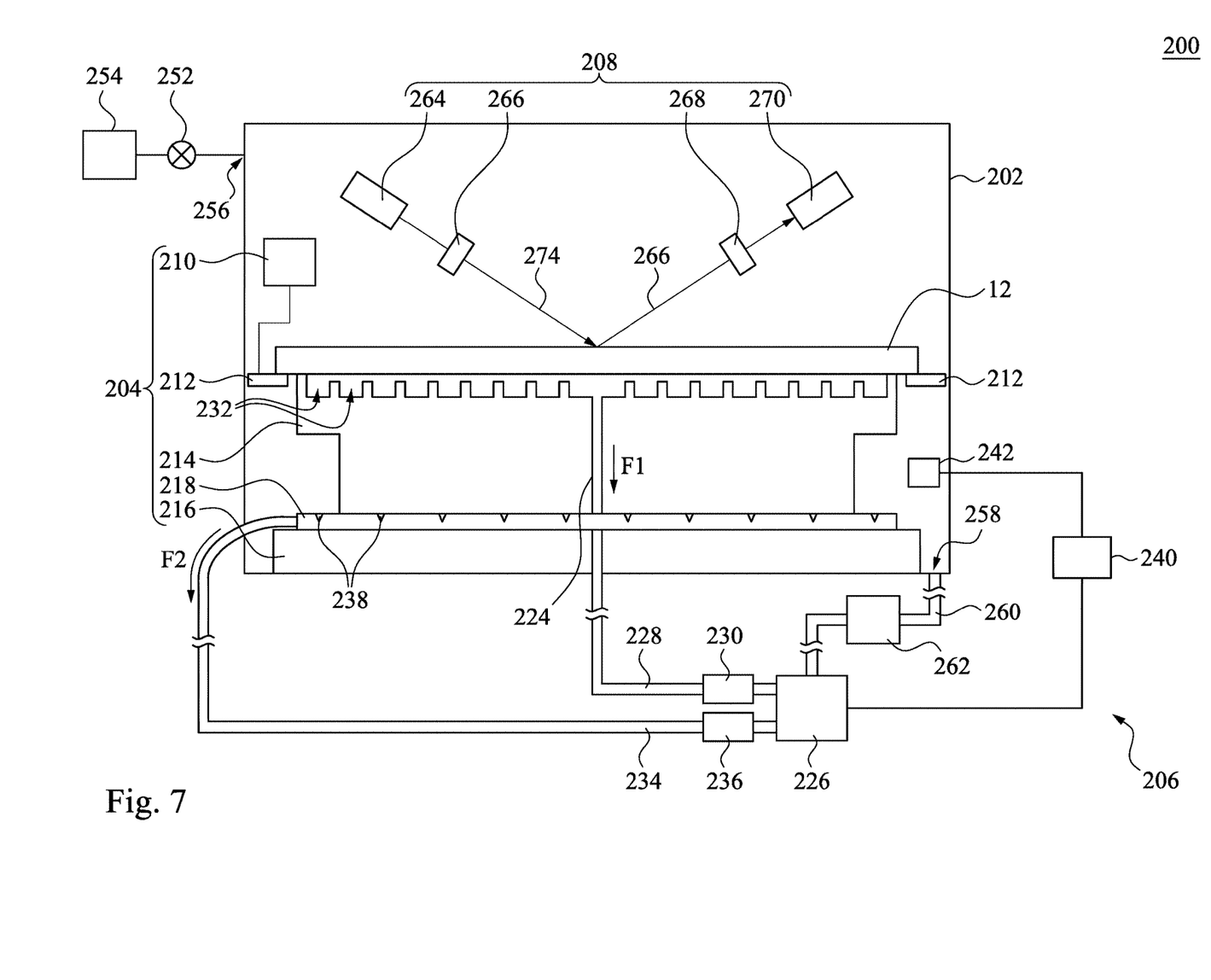

Returning to FIG. 1, the method 10 then proceeds to block S5 where a post-CMP thickness of the wafer is measured by a measurement tool. With reference to FIG. 7, in some embodiments of block S5, the thickness of the wafer 12 is measured by a polarized light beam 274 which is produced by the light source 264 and polarized by the polarizer 266. The first vacuum suction force F1 is maintained to hold the wafer firmly in place (e.g., on the wafer chuck 214) during the post-CMP thickness measurement of the wafer 12. In some embodiments, the post-CMP thickness measurement of the wafer 12 is performed after applying the second vacuum suction force F2 (e.g., after turning on the second valve 236). The second vacuum suction force F2 applied using the porous pipe 218 is maintained to draw away the contaminant particles on the backside of the wafer 12 during the post-CMP thickness measurement of the wafer 12 as well. In some embodiments, the post-CMP thickness of the wafer 12 is measured by an ellipsometry method, for example, using an ellipsometer. Ellipsometry is an optical technique for investigating properties of thin films, and can be used to characterize thickness or depth. The change in polarization is used as a signal after an incident light interacting with the material structure of the epitaxy. This is because that the polarization change depends on the thickness of the wafer 12. The reflected light beam, labeled 276, passes through the analyzer 268 before reaching the detector 270. The wafer 12 measured by the integrated optical measurement system 200 with the porous pipe 218 surrounding the wafer chuck 214 has reduced contaminant particles 24 on the backside thereof compared to that being measured by the integrated optical measurement system 200 without the porous pipe 218 surrounding the wafer chuck 214. For example, contaminant particle counts on the backside of the wafer 12 after the wafer 12 is measured by the integrated optical measurement system 200 with the porous pipe 218 is in a range from about 58% to about 97% of the contaminant particle counts on the backside of the wafer 12 after the wafer 12 is measured by the integrated optical measurement system 200 without the porous pipe 218. After the post-CMP thickness measurement of the wafer 12, the wafer 12 is transferred from the integrated optical measurement system 200 to other processing chambers C1-C6 or the load lock chambers 118, 120 using the automated robotic arm RA. The first vacuum suction force F1 and the second vacuum suction force F2 may be stopped applying by the system controller 240 after the post-CMP thickness measurement. In other words, the first valve 230 and the second valve 236 are turned off after the post-CMP thickness measurement of the wafer 12.

In some embodiments, the step of stopping applying the second vacuum suction force F2 is carried out after stopping applying the first vacuum suction force F1 to prevent the contaminant particles 24 being sucked to the backside of the wafer 12, which is caused by the first vacuum suction force F1. In other words, the second valve 236 is turned off after turning off the first valve 230. In some other embodiments, the step of stopping applying the second vacuum suction force F2 is carried out before stopping applying the first vacuum suction force F1. In other words, the second valve 236 may be turned off before turning off the first valve 230. It is noted that vacuum stages (e.g., the wafer chuck 214) may be used in other operations of IC fabrication, and the porous pipe 218 may be utilized in these other operations for such contamination reduction.

Figure 8A:
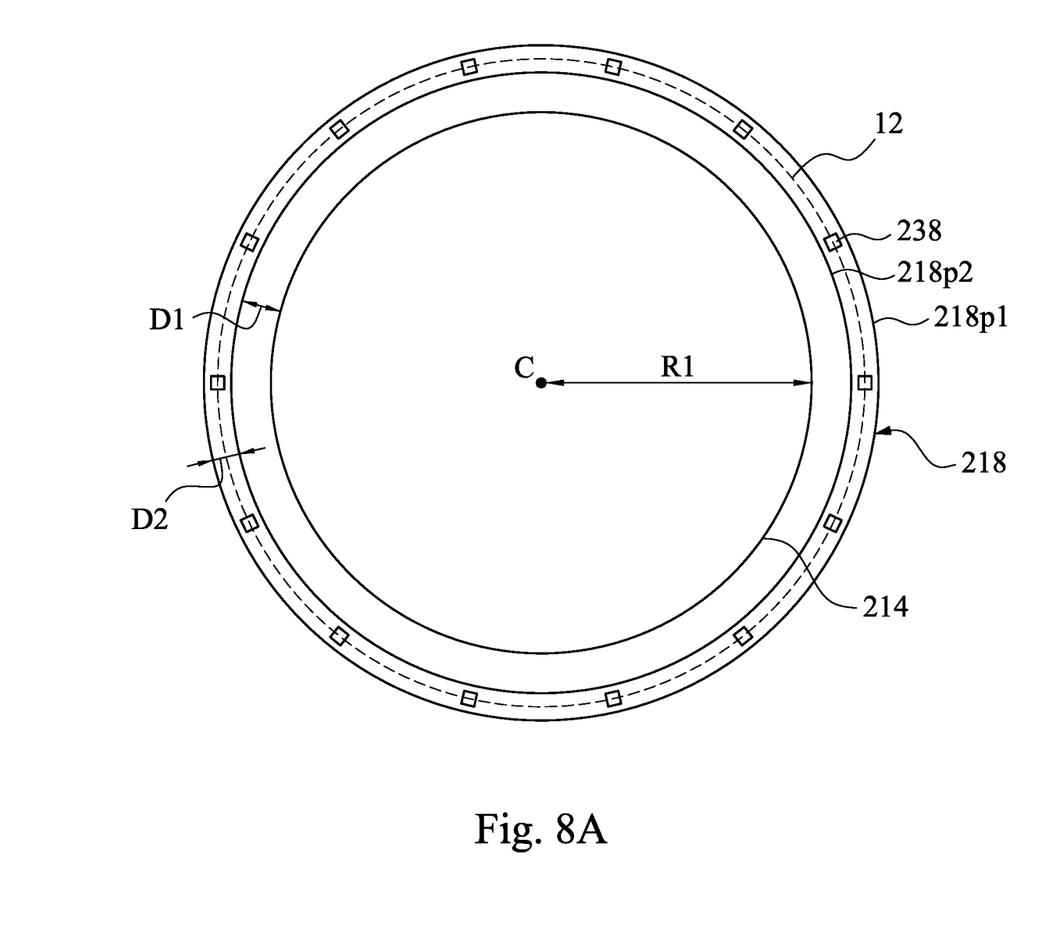
FIGS. 8A-8C illustrate top views of a wafer secured to a wafer chuck, which is surrounded by a porous pipe with various geometric shapes, in accordance with some embodiments.
Figure 8B:
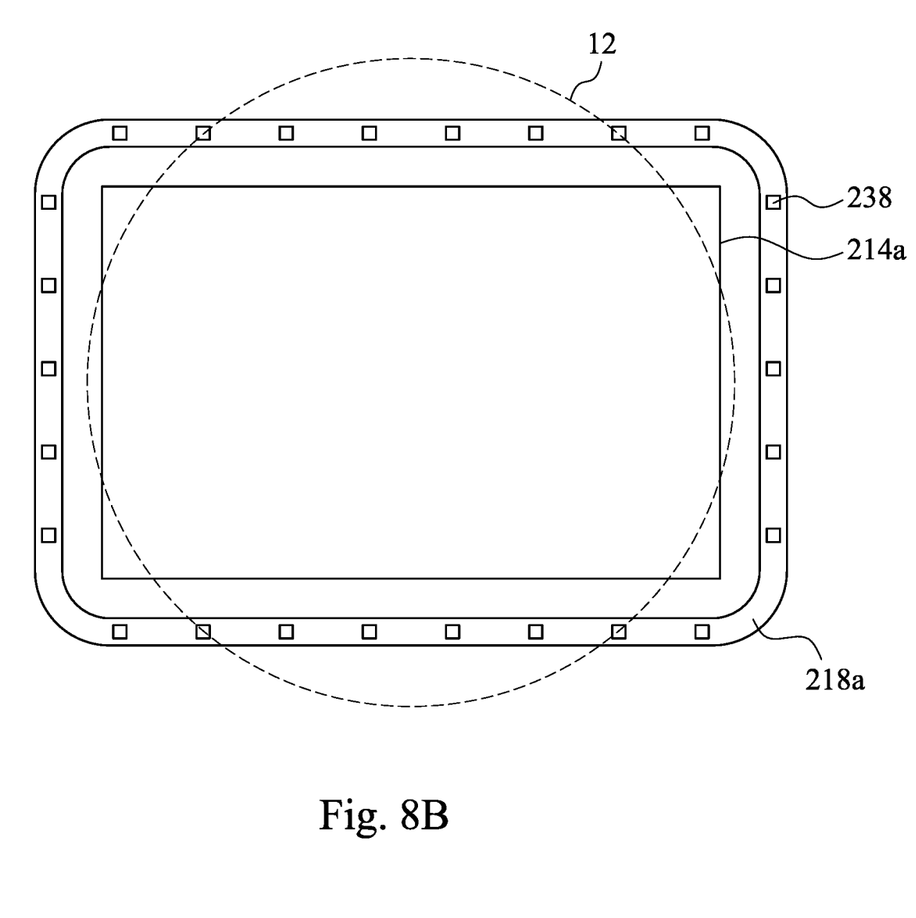
Figure 8C:
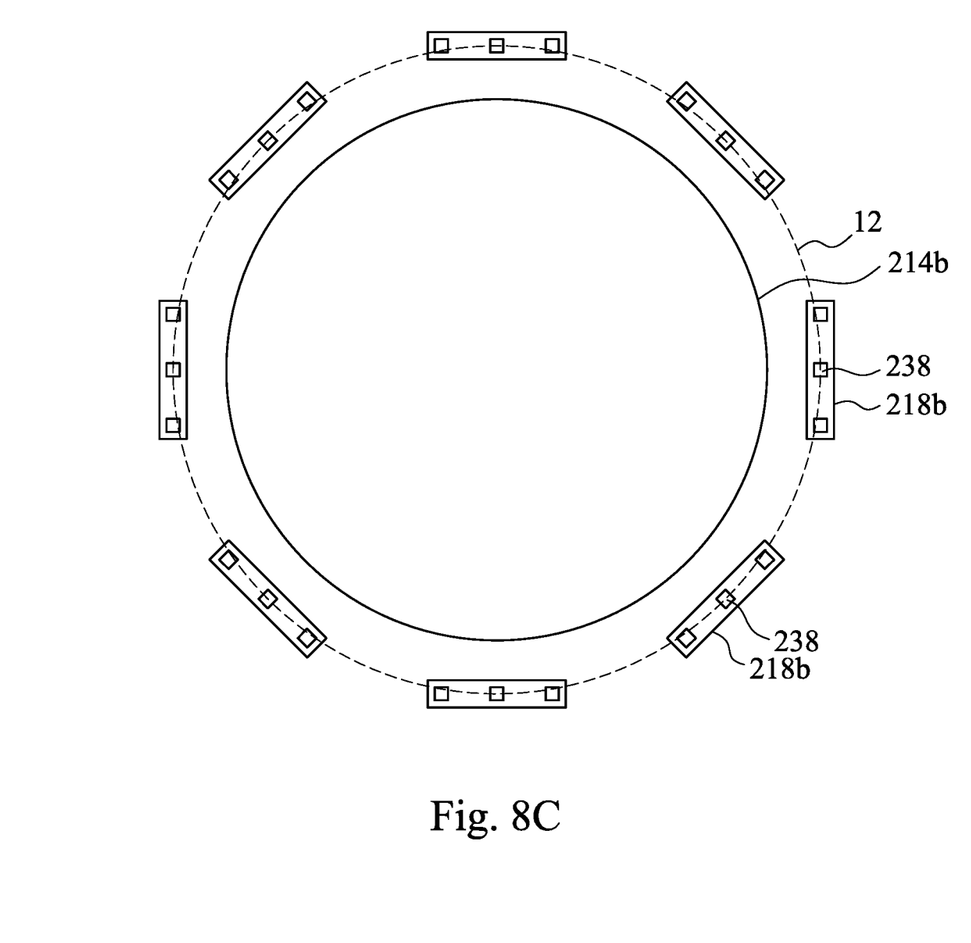

FIGS. 8A-8C illustrate top views of the wafer 12 secured to the wafer chuck 214, which is surrounded by the porous pipe 218 with various geometric shapes, in accordance with some embodiments. The positions of the through holes 238 within the porous pipe 218 are shown to illustrate the position of those through holes 238 with respect to the wafer (represented by a dotted line 12). Reference is made to FIG. 8A. The porous pipe 218 is positioned continuously around a periphery of the wafer chuck 214. The porous pipe 218 has a shape substantially the same as a shape of the wafer chuck 214. In some embodiments, the wafer chuck 214 is circular shaped and the porous pipe 218 is circular shaped as well. In some embodiments, an outer periphery 218p1 of the porous pipe 218 is farther away from a center C of the wafer chuck 214 than a periphery the wafer 12, and the inner periphery 218p2 of the porous pipe 218 is closer to the center C of the wafer chuck 214 than the periphery of the wafer. The outer periphery 218p1 of the porous pipe 218 is farther from the periphery of the wafer chuck 214 than the inner periphery 218p2 of the porous pipe 218 is. The wafer chuck 214 may have a radius R1 in a range from about 10 mm to about 15 mm. In some embodiments, the porous pipe 218 is placed spaced apart from the periphery of the wafer chuck 214 by a distance D1. In other words, the inner periphery 218p2 of the porous pipe 218 and the periphery of the wafer chuck 214 have a distance D1 therebetween. In some embodiments, the distance D1 is in a range from about 3 mm to about 7 nm. If the distance D1 is less than about 3 nm, the porous pipe 218 may adversely affect the vertical movement of the wafer chuck 214. If the distance D1 is greater than about 7 nm, the contaminant particles 24 on the backside of the wafer 12 may not be effectively drawn away by the porous pipe 218. The porous pipe 218 may be formed of ring-shaped cross-section and about ⅛ inch in a ring thickness D2. During applying the second vacuum suction force F2, the pressure in the porous pipe 218 and the second gas line 234 may be in a range from about 300 mmHg to about 1300 mmHg. If the pressure is above about 1300 mmHg, the pressure may be too high and may cause damage to the wafer. If the pressure in the porous pipe 218 and the second gas line 234 is below about 300 mmHg, the contaminant particles 24 may not be effectively drawn by the second vacuum suction force F2.

Reference is made to FIG. 8B. FIG. 8B shows a wafer chuck 214a and a porous pipe 218a similar to the wafer chuck 214 and the porous pipe 218, except for the wafer chuck 214a is rectangular and the porous pipe 218a is rectangular-ring-shaped as well. Reference is made to FIG. 8C. FIG. 8C shows a wafer chuck 214b and a plurality of porous pipe 218b similar to the wafer chuck 214 and the porous pipe 218, except for the porous pipe 218b are positioned around the periphery of the wafer chuck 214b at intervals. In some embodiments, the porous pipes 218b are arranged equidistantly. In some other embodiments, the porous pipes 218b may be arranged randomly or may be arranged in a symmetrical and/or a regular pattern. However, it is understood that the number of the porous pipes 218b is only for illustration purposes and are not limiting.

Based on the above discussion, it can be seen that the present disclosure offers advantages. It is understood, however, that other embodiments may offer additional advantages, and not all advantages are necessarily disclosed herein, and that no particular advantages are required for all embodiments. One advantage is that contaminant particles on the backside of the wafer can be drawn away by the porous pipe around the wafer chuck when the vacuum pump connected to the wafer chuck generates a suction force to hold the wafer. Another advantage is that the through holes of the porous pipe is formed using a hand-held implement, so that the through holes can be cut to size at the jobsite. Still another advantage is that contaminant particles can be effectively drawn away by positioning the porous pipe having the contour conformal to the contour of the wafer chuck.

In some embodiments, a method includes transferring a wafer from a process chamber onto a plurality of robotic fingers outside the process chamber, elevating a wafer chuck until reaching the wafer, applying a first suction force to the wafer using a vacuum hole on the wafer chuck, and applying a second suction force toward the wafer using a porous pipe around the wafer chuck.

In some embodiments, a method includes reducing a distance between a wafer and a wafer chuck until the wafer is in contact with the wafer chuck, turning on a first valve connected between a hole on the wafer chuck and a vacuum pump, and turning on a second valve connected between a porous pipe outside the wafer chuck and the vacuum pump.

In some embodiments, an apparatus includes a wafer chuck, a pipe alongside the wafer chuck, in which the pipe has a plurality of through holes on a top surface of the pipe, a vacuum pump, and a first gas line connecting the vacuum pump and the pipe.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
transferring a wafer from a process chamber onto a plurality of robotic fingers outside the process chamber;
elevating a wafer chuck until reaching the wafer;
applying a first suction force to the wafer using a vacuum hole on the wafer chuck; and applying a second suction force toward the wafer using a porous pipe around the wafer chuck, wherein the porous pipe laterally surrounds the wafer chuck and has a plurality of through holes, and two of the through holes of the porous pipe are spaced apart by a distance greater than a diameter of the wafer chuck.

2. The method of claim 1, wherein the second suction force applied using the porous pipe is greater than the first suction force applied using the vacuum hole on the wafer chuck.

3. The method of claim 1, wherein the second suction force is intermittently applied.

4. The method of claim 1, further comprising:
stopping applying the second suction force prior to stopping applying the first suction force.

5. The method of claim 1, wherein the second suction force applied using the porous pipe is maintained during applying the first suction force using the vacuum hole on the wafer chuck.

6. The method of claim 1, wherein applying the second suction force using the porous pipe is performed after applying the first suction force using the vacuum hole on the wafer chuck.

7. The method of claim 1, wherein the applying the second suction force using the porous pipe and applying the first suction force using the vacuum hole on the wafer chuck are performed simultaneously.

8. The method of claim 1, further comprising:
measuring a thickness of the wafer during applying the second suction force using the porous pipe.

9. The method of claim 1, further comprising:
determining whether a particle is present on a backside of the wafer, wherein the second suction force is applied when the determination determines that the particle is present.

10. A method, comprising:
reducing a distance between a wafer and a wafer chuck until the wafer is in contact with the wafer chuck;
turning on a first valve connected between a hole on the wafer chuck and a vacuum pump; and
turning on a second valve connected between a porous pipe outside the wafer chuck and the vacuum pump, wherein a top-view contour of the porous pipe forms a circle having a diameter greater than a diameter of the wafer chuck.

11. The method of claim 10, wherein the second valve is turned on after turning on the first valve.

12. The method of claim 10, further comprising:
turning off the second valve before turning off the first valve.

13. The method of claim 10, further comprising:
measuring a thickness of the wafer after the second valve is turned on.

14. The method of claim 13, further comprising:
turning off the second valve after measuring the thickness of the wafer.

15. The method of claim 10, further comprising turning off the second valve, wherein the turning on and off of the second valve is intermittent.

16. The method of claim 10, wherein turning on the first valve is such that a particle is drawn to the wafer.

17. The method of claim 16, wherein turning on the second valve is such that the particle is drawn away from the wafer.

18. An apparatus, comprising:
a wafer chuck;
a pipe laterally surrounding the wafer chuck, wherein the pipe has a plurality of through holes located externally to the wafer chuck;
a vacuum pump; and
a first gas line connecting the vacuum pump and the pipe.

19. The apparatus of claim 18, further comprising:
a second gas line connecting the vacuum pump and a hole on the wafer chuck.

20. The apparatus of claim 19, further comprising:
a first valve in the first gas line; and
a second valve in the second gas line, wherein the first valve and the second valve are asynchronously controlled.

* * * * *